United States Patent [19]
Collins et al.

[11] Patent Number: 4,863,576
[45] Date of Patent: Sep. 5, 1989

[54] METHOD AND APPARATUS FOR HERMETIC COATING OF OPTICAL FIBERS

[76] Inventors: George J. Collins, 807 W. Oak St., Fort Collins, Colo. 80521; John R. McNeil, 13423 Desert Hills NE., Albuquerque, N. Mex. 87111

[21] Appl. No.: 144,750

[22] Filed: Jan. 19, 1988

Related U.S. Application Data

[63] Continuation of Ser. No. 903,688, Sep. 4, 1986, abandoned.

[51] Int. Cl.[4] ............................................. C23C 14/34
[52] U.S. Cl. ......................... 204/192.15; 204/192.23; 204/298
[58] Field of Search ............... 204/298, 192.1, 192.12, 204/192.15, 192.17, 192.22, 192.23, 298 GF, 298 PS, 298 CS, 298 AN, 298 ME, 298 CM, 298 SC

[56] References Cited
U.S. PATENT DOCUMENTS

| | | | |
|---|---|---|---|
| 3,995,187 | 11/1976 | Penfold et al. | 313/346 R |
| 4,030,996 | 6/1977 | Penfold et al. | 204/192 R |
| 4,031,424 | 6/1977 | Penfold et al. | 204/298 X |
| 4,426,275 | 1/1984 | Meckel et al. | 204/298 |
| 4,428,810 | 1/1984 | Webb et al. | 204/298 X |
| 4,478,703 | 10/1984 | Edamura et al. | 204/298 |
| 4,492,620 | 1/1985 | Matsuo et al. | 204/298 X |
| 4,505,798 | 3/1985 | Ramachandran et al. | 204/298 |
| 4,530,750 | 7/1985 | Aisenberg et al. | 204/298 |
| 4,540,466 | 9/1985 | Nishizawa | 204/298 X |
| 4,585,541 | 4/1986 | Miyake et al. | 204/298 |

OTHER PUBLICATIONS

R. W. Springer and C. D. Hosford, J. Vac. Sci. Technol., 20(3), Mar. 1982, pp. 462–465, entitled Characterization of aluminum–aluminum nitride coatings sputter deposited using the pulsed gas process.

John A. Thornton, J. Vac. Sci. Technol. 15(2), Mar.-/Apr. 1978, pp. 171–177, entitled Magnetron sputtering: basic physics and application to cylindrical magnetrons.

*Primary Examiner*—Nam X. Nguyen
*Attorney, Agent, or Firm*—William E. Hein

[57] ABSTRACT

Apparatus for coating optical fibers with thin hermetic films based on cylindrical magnetron reactive sputtering and charged particle assisted deposition is disclosed. The thin film coated on the fiber is composed of material sputtered from a cylindrical cathode as well as material from reactive feedstock gases. The cylindrical cathode insures uniform deposited film thickness on a cylindrical fiber at high deposition rates. A cylindrical inner extraction grid acts to create ion or electron bombardment of the outer surface of the fiber as it is coated. As a consequence of the enclosed cylindrical geometry, the high magnetron sputtering rate, and the in-situ charged particle bombardment, hermetic coatings of high quality may be placed on fibers pulled through the deposition apparatus at rates of 1–20 meters/second. An external laser beam directed along the longitudinal axis of the cylindrical magnetron may be employed to improve the coating process.

30 Claims, 4 Drawing Sheets

METHOD AND APPARATUS FOR HERMETIC COATING OF OPTICAL FIBERS

This application is a continuation of application Ser. No. 903,688, filed Sept. 4, 1986, now abandoned.

BACKGROUND OF THE INVENTION

HMF glasses, both vitreous and crystalline, possess desirable optical properties for potential use as mid-IR optical fibers, including a broad transmittance range from the mid-IR (approximately 7 microns) to near-UV (approximately 0.3 microns), low absorption and scatter losses, and high tensile strength.

During the past several years a number of artisans have demonstrated the feasibility of using heavy metal fluoride (HMF) glasses for a variety of ultralow-loss fiber optic waveguides and mid-IR optical fiber applications. Included have been ultralong repeaterless links, nuclear radiation resistant links, high-capacity wavelength multiplexed fiber optic systems, mid-IR power delivery fibers, and long-length fiber optic sensor systems.

Despite these impressive results, HMF glasses exhibit problems which tend to limit their further development and future application. Specifically, HMF glasses degrade rapidly when exposed to high humidity, are chemically sensitive, and have low softening temperatures, typically 200 degrees C.

Several artisans have investigated sealing the fiber surface with a hermetic layer to prevent ambient moisture from contacting the glass and to thereby prevent subsequent stress corrosion. While some progress has been made in understanding and alleviating these problems, no solution to these difficulties is yet available. This is indeed unfortunate considering that much of the underlying technology for HMF glass and optical fibers development is established and ready for implementation. Prior studies have shown that the solubility of typical fluorozirconates, a category of heavy metal fluoride (HMF) glasses, is many orders of magnitude greater than that of silicates. Additionally, prior measurements of fiber strength reveal that HMF optical fibers degrade rapidly when exposed to high humidity. Finally, it is generally known that conventional protective Teflon coatings do not serve as effective barriers against the degradation. Thus, despite their promising optical characteristics, many fluoride glass compositions are relatively soft and hygroscopic, thereby preventing their practical use.

Compounding the above problems, fluoride glass materials have low softening temperatures, typically 200 degrees C. This precludes application of standard thin film deposition techniques which require a substrate temperature in excess of 250–300 degrees C. In conventional deposition schemes this elevated substrate temperature is required to produce thin films which are durable, non-porous, and have good substrate adhesion; otherwise, the film does not provide a good hermetic coating.

An additional problem exists when one considers coating HMF glasses in fiber form, as they are being pulled. Typically, the rate that fiber is drawn exceeds 3 meters/minute. To form a hermetic coating on the fiber, a minimum thickness of 1000 Angstroms is required. In the case of a practical coating apparatus operating on the fly, a fiber coating region approximately 25 centimeters in length should be constructed. During a 5-second time period in which the fiber passes through the 25-centimeter long region, it must be coated with a film 1000 Angstroms in thickness. This dictates a deposition rate of approximately 200 Angstroms/second, which is approximately 60 times that of conventional deposition techniques. This increased deposition rate, combined with low (200 degrees C.) substrate temperature, can have a profound deleterious influence on film morphology and hence on film hermeticity and durability. A coating apparatus which would scale to several meters in length would allow a proportionate reduction in the film deposition rate from that of a 25-centimeter length.

HMF optical fibers, loaded rapidly or forced to support a given load for a short time, are relatively strong, whereas those fibers are relatively weak if loaded slowly or forced to support a load for a longer time. Furthermore, the strength of fibers decreases as temperature increases and the relative humidity of the surrounding environment increases. Fibers have been found to be weakest when immersed in water. This susceptibility to attack by moisture indicates that hermetic coatings are required to protect HMF glasses. Moreover, because HMF glasses are chemically sensitive, an additional requirement is that optical coatings must be applied in a non-damaging way.

There are a number of known ways to guard against HMF optical fiber fatigue. However, the most attractive alternative still remains a hermetic coating to protect the fiber. Some known artisans coated the glass fibers with a UV-curable epoxy acrylate to increase the long-term strength of the glass fibers. Others have utilized metal to protect the surface of the fibers. Yet others have deposited diamond-like carbon (DLC) to provide a number of properties that could result in improved optical elements such as windows and mirrors for high powered lasers. A polycrystalline aluminum applied by freeze-coating suffers from cyclic fatigue and subsequent microbending loss. The resulting fiber does achieve fatigue resistance. However, long hermetic lengths have not passed time/temperature stress tests. A silicon oxynitride coating has passed stress tests, has exhibited no optical performance degradation, and provides substantial fatigue resistance. But, the silicon oxynitride coated fibers are not suitable for use under high stress in boiling water. Other artisans have found that the superior fatigue resistance of the silicon oxynitride-coated fiber allows significantly higher design stresses in service as compared to the polymer-coated fiber. Others have applied ion assisted deposition (IAD) techniques to deposit $MgF_2$, $SiO_2$ and $Al_2O_3/SiO_2$ thin film structures on fluoride glass substrates at ambient substrate temperature of approximately 100 degrees C. The coatings deposited using IAD improve the environmental durability of the fluoride glass and appear to have reasonably good optical characteristics. Without application of IAD, the deposited coatings are not durable and have poor adhesion.

SUMMARY OF THE INVENTION

The present invention relates to a new apparatus and method for reactive sputter deposition to coat HMF glass fibers with hermetic seals. A cylindrical magnetron having a coaxial inner extraction grid and anode is able to tailor thin film properties toward those characteristics required of hermetic coatings via the use of ion or electron assisted deposition. Film morphology, stress, and microstructure are greatly influenced by ion and electron bombardment during deposition, which is not possible using conventional coating techniques. External bombardment is very important when one is concerned with achieving film hermeticity at low substrate temperatures and at high deposition rates. A crucial feature of the cylindrical magnetron of the present invention is that it allows the substrate temperature to be much lower yet still produce good quality hermetic coatings with compressive stress fabricated at high deposition rates. The present cylindrical magnetron provides flexibility in the stoichiometry of the deposited film. It can be used to provide coating/substrate chemical combinations that are not possible using conventional deposition techniques.

The present cylindrical magnetron having a coaxial inner extraction grid and anode allows one to simultaneously achieve: high deposition rates via reactive sputtering; either ion or electron bombardment of the fiber during the deposition of the fiber coating; easy scaling of the deposition zone to long lengths; and a cylindrical deposition geometry which aids the uniform coating of a cylindrical optical fiber. Finally, this cylindrical magnetron geometry lends itself to laser assisted reactive sputtering since the narrow cylinder with reflective walls acts to guide a laser beam down the optically unobstructed length of the coating region. Alternatively, a laser may propagate along the longitudinal axis of the cylinder guided by mirrors.

In practice, the feedstock reactive gas and associated rare gas buffer are introduced into the cylindrical magnetron region at a pressure of 1–10 microns. A conventional solenoid is used to create a longitudinal magnetic field along the longitudinal axis of the cylindrical cathode. A power supply creates a plasma discharge between the cathode and an associated coaxial anode resulting in magnetron enhanced sputtering of the cathode material. The plasma discharge also acts to dissociate the reactive feedstock gases into free radicals. The cathode material and the reactive free radicals from the plasma discharge subsequently react and condense on the outer surface of the fiber to form a hermetic coating. During film deposition on the fiber an auxillary power supply places an appropiate potential on an inner extraction grid to accelerate ions or electrons from the plasma discharge toward the outer surface of the fiber. The ions or electrons impinge on the film as it deposits on the fiber and assist the formation of a uniform thickness coating that is pinhole free and that possesses high density and exhibits compressive stress. Independent control over the flux and the energy of the charge particle bombardment is achieved by employing additional extraction grids for independent intensity control and particle energy control. An external laser beam may be directed within the magnetron cylinder surrounding the fiber to assist film deposition. Both laser wavelength and intensity are independently controllable.

DESCRIPTION OF THE ILLUSTRATED EMBODIMENT OF THE INVENTION

Figure 1:
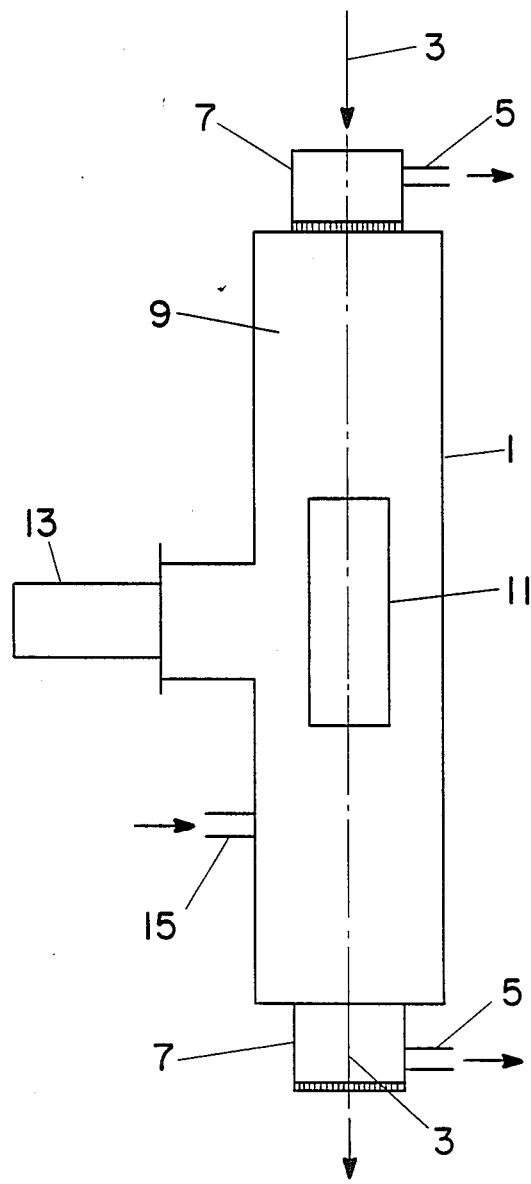
FIG. 1 is an illustration of a fiber coating vacuum apparatus including an input feedthrough, a cylindrical magnetron region where deposition occurs, and an output feedthrough.

Referring now to FIG. 1, an optical fiber 3 to be coated is drawn through a three stage cylindrical magnetron vacuum apparatus 1. The fiber 3 is drawn by a conventional capstan and wound onto a take-up drum at low tension. The typical draw speed is 1–20 meters/minute. Holes are drilled into each of two end feedthroughs 7 of the vacuum apparatus 1 and fitted with conventional o-rings to accommodate the passage of the optical fiber 3 while isolating the vacuum apparatus 1 from the outside environment. Differential pumping ports 5 located on the end feedthroughs 7 permit a transition from atmospheric pressure outside the vacuum apparatus 1 to the 1–10 micron pressure established within a central vacuum chamber 9 of magnetron vacuum apparatus 1. The central vacuum chamber 9 surrounds a cylindrical magnetron 11 and is maintained at the desired operating pressure by high vacuum pump 13. Feedstock gases are introduced into the central vacuum chamber 9 via a gas input port 15.

Figure 2:
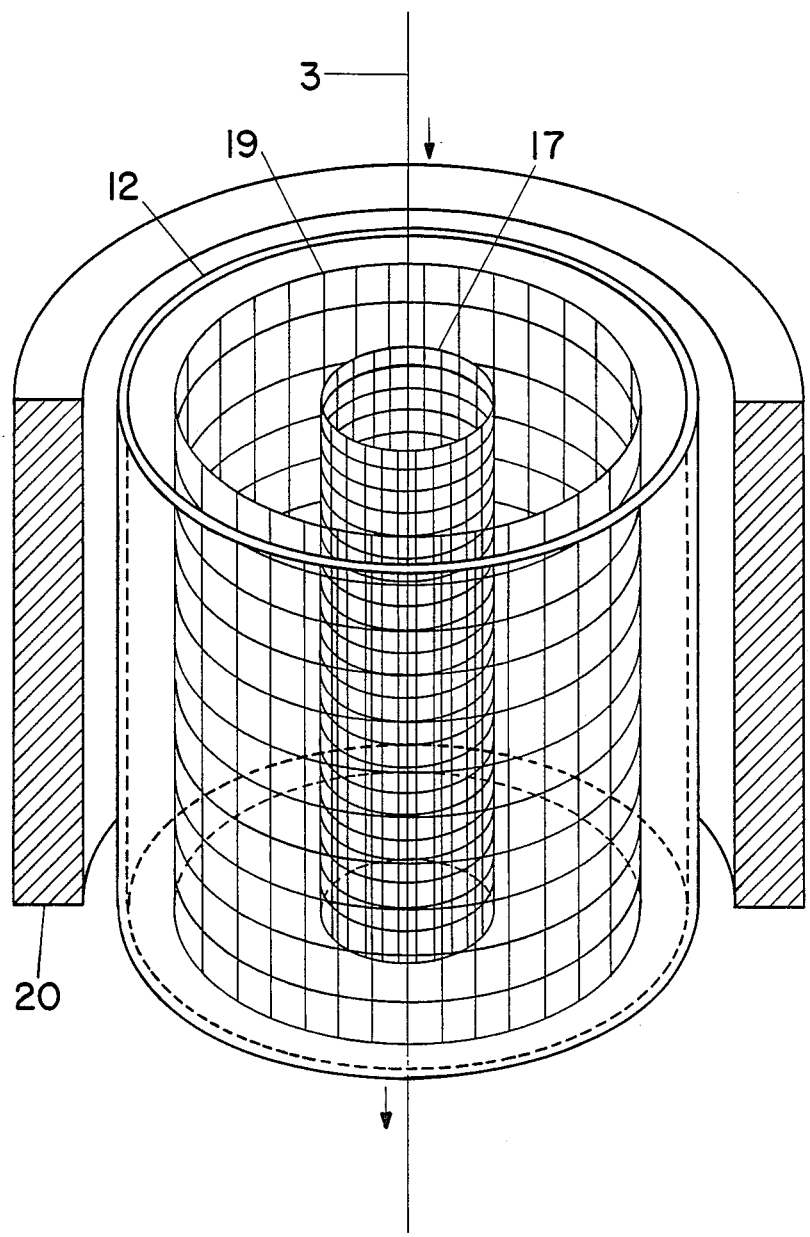
FIG. 2 is a detailed illustration of the cylindrical magnetron of FIG. 1 showing an anode, cathode, and extraction grid that are all coaxial along a longitudinal axis of the drawn fiber, together with a solenoid for creating a magnetic field along that longitudinal axis.

Referring now to FIG. 2, there is shown a cross-sectional pictorial representation of the cylindrical magnetron 11 of FIG. 1 that includes a cylindrical mesh anode 19, an inner extraction grid 17, and optical fiber 3, all of which are positioned coaxially along a longitudinal axis of fiber 3. A conventional solenoid 20, also positioned coaxially along the longitudinal axis of fiber 3, provides a magnetic field along that longitudinal axis to trap plasma electrons that exist in a volume 4 enclosed within cylindrical cathode 12 and to thereby increase the efficiency of ion production.

Figure 3:
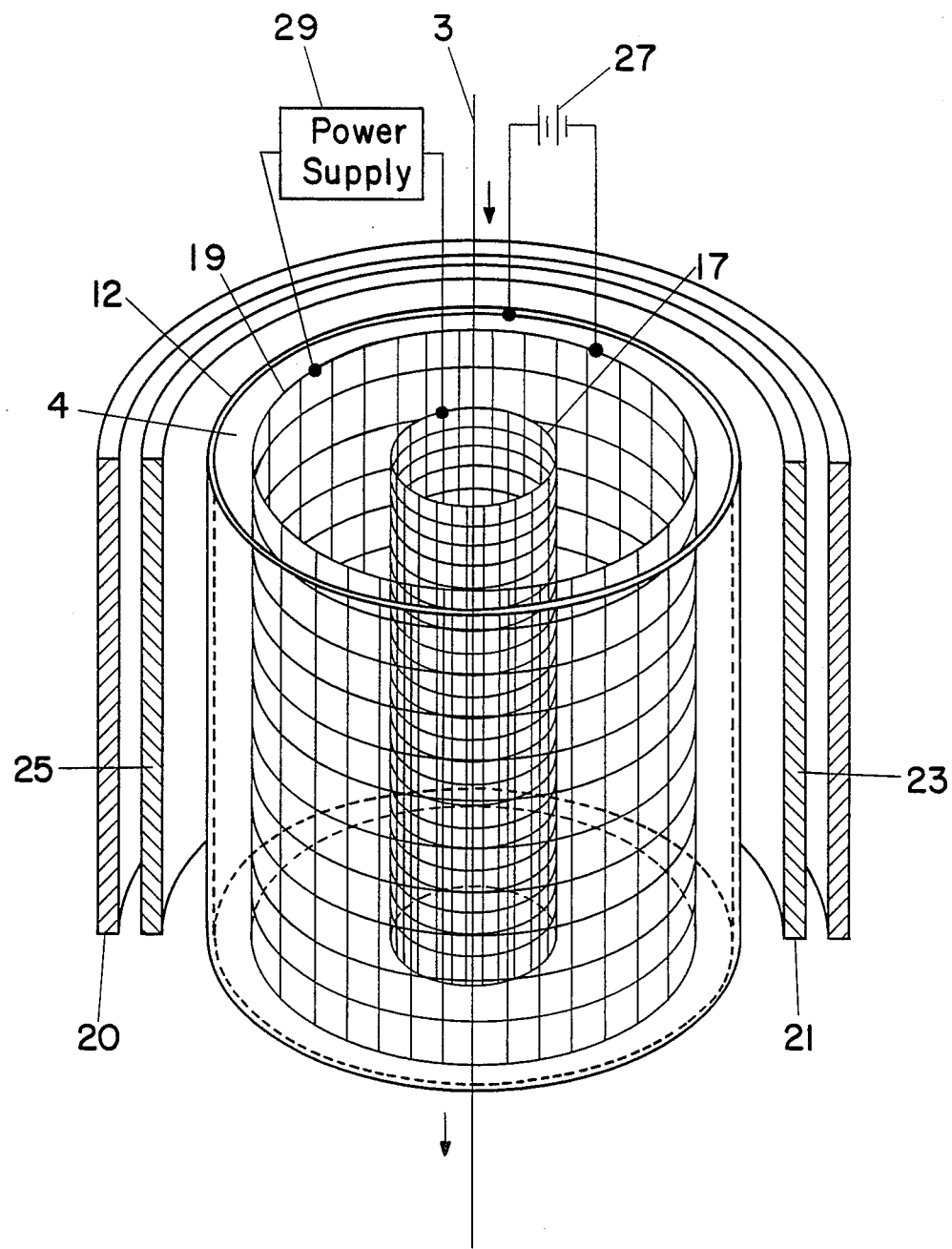
FIG. 3 is a more detailed illustration of the apparatus of FIG. 2 showing an annular cathode cooling cavity and relative electrical potentials on the cylindrical magnetron cathode, coaxial anode, and coaxial extraction grid.

Referring now to FIG. 3, a negative potential is applied to a cylindrical cathode 12, and a positive potential is applied to cylindrical anode 19 by a power supply 27. A cylindrical plasma is created in the volume 4. enclosed within cylindrical cathode 12 to dissociate feedstock gases. A variable power supply 29 is connected between the cylindrical anode 19 and the inner extraction grid 17. An annular cooling cavity 21 includes a liquid or gas inlet 23 and an outlet 25. The annular cooling cavity 21 holds the cylindrical cathode 12 by being press-fitted thereto.

Fiber coating operation proceeds by first threading the fiber 3 to be coated through the two end feedthroughs 7 so as to lie in a straight line represented by the longitudinal axis of the magnetron vacuum apparatus 1. Selected reactant and buffer gases are then introduced into the central vacuum chamber 9 via gas input port 15. The pressure in the central vacuum chamber 9 is determined by the chosen flow rate into gas input port 15 and the pump speed of the high vacuum pump 13. The power supply 27 is activated so that reactive magnetron sputtering of a coating onto fiber 3 occurs. In this regard, it is essential that both the cylindrical anode 19 and the inner extraction grid 17 be open mesh structures to permit transport of sputtered material from the inner surface of the cylindrical cathode 12 through those elements and onto fiber 3. The cylindrical plasma created within volume 4 surrounded by the cylindrical cathode 12 is able to dissociate the feedstock gases into free radicals. Finally, variable power supply 29 determines the charged particle bombardment conditions at the outer surface of the fiber 3. Pulling of the fiber 3 through the magnetron vacuum apparatus 1 at the chosen rate is then begun.

Figure 4:
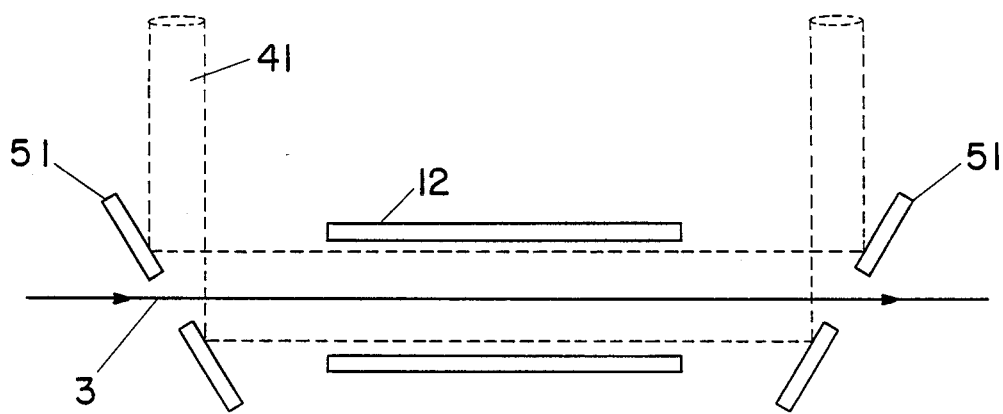
FIG. 4 illustrates the addition of a coaxial laser beam and associated optics to the apparatus of FIG. 1.

Referring now to FIG. 4, a laser beam 41 may be transmitted through the cylindrical cathode 12 either along the longitudinal axis of the fiber 3, as shown, or via multiple internal reflections from the inner surface of the cylindrical cathode 12. Tilted end mirrors 51 with holes in the center thereof for accommodating fiber 3 may be employed to align the laser beam 41 with respect to the fiber 3. When the laser beam 41 is injected along the axis of fiber 3, the end mirrors 51 are situated within the magnetron vacuum apparatus 1. Optical ports on the magnetron vacuum apparatus 1 may be employed to permit entry and exit of the laser beam 41. The wavelength of the laser beam 41 is chosen so as to selectively photodissociate reactant feedstock gases. The use of laser beam 41 results in increased deposition rates, tunable film stoichiometry, and improved hermeticity of the deposited fiber coating.

The cylindrical magnetron 11 may be readily scaled in length along its longitudinal axis in order to lengthen the deposition zone and thereby reduce the rate of deposition to maintain a given coating thickness at a selected fiber draw rate. Moreover, additional cylindrical magnetrons may be placed in tandem along the longitudinal axis of fiber 3 in order to deposit multi-element coatings, each coating element being sputtered from a different one of the cylindrical magnetrons. In this arrangement, the voltages applied to the structural elements comprising each of the tandem cylindrical magnetrons are independently controlled to facilitate separate control of the sputtering rate and ion or electron bombardment flux parameters associated with each of the tandem cylindrical magnetrons.

We claim:

1. Apparatus for depositing a thin film hermetic coating on a drawn fiber, the apparatus comprising:
   vacuum chamber means;
   a cylindrical magnetron positioned within said vacuum chamber means, the cylindrical magnetron having a longitudinal axis that is substantially coincident with a longitudinal axis of the drawn fiber, the cylindrical magnetron comprising a cylindrical mesh extraction grid coaxially positioned with respect to the drawn fiber to surround the drawn fiber, a cylindrical mesh anode, coextensive with the cylindrical mesh extraction grid, having a diameter greater than the diameter of the cylindrical mesh extraction grid, and coaxially positioned with respect to the drawn fiber to surround the cylindrical mesh extraction grid, a cylindrical cathode, coextensive with the cylindrical mesh extraction grid and cylindrical mesh anode, having a diameter greater than the diameter of the cylindrical mesh anode, and coaxially positioned with respect to the drawn fiber to surround the cylindrical mesh anode, and cylindrical solenoid means, coextensive with the cylindrical mesh extraction grid, cylindrical mesh anode, and cylindrical cathode, having a diameter greater than the diameter of the cylindrical cathode, and coaxially positioned with respect to the drawn fiber to surround the cylindrical cathode, said cylindrical cathode having an inner surface comprising a desired material to be sputtered therefrom and uniformly deposited, through said cylindrical mesh anode and through said cylindrical mesh extraction grid, onto the drawn fiber;
   power supply means for applying selected voltages to the cylindrical cathode, cylindrical mesh anode, cylindrical mesh extraction grid, and cylindrical solenoid means, the application of said selected voltages causing the formation of a cylindrical plasma substantially confined within a volume enclosed within said cylindrical cathode and without said cylindrical mesh anode;
   vacuum control means coupled to the vacuum chamber means for establishing and maintaining a desired vacuum within the vacuum chamber means; and
   gas port means coupled to the vacuum control means and vacuum chamber means for admitting and controlling the flow of one or more selected reactive feedstock gases into the vacuum chamber means;
   said cylindrical plasma being operative for dissociating the one or more selected reactive feedstock gases into one or more constituent elements, one or more of which constituent elements reacts with the material sputtered from the inner surface of said cylindrical cathode for uniform deposition as a film onto the drawn fiber;
   said cylindrical solenoid means being operative for trapping plasma electrons within said cylindrical plasma and for increasing the efficiency of ion production; and
   said cylindrical mesh extraction grid being operative for accelerating ions or electrons created in said cylindrical plasma toward the drawn fiber for bombardment by said ions or electrons of said film deposited on said drawn fiber, thereby providing control over the stoichiometry of said film.

2. Apparatus for depositing a thin film hermetic coating on a drawn fiber as in claim 1 wherein the vacuum chamber means comprises a central portion adjacent the cylindrical magnetron and inlet and outlet portions;
   the apparatus further comprising differential pumping means coupled to the inlet and outlet portions of the vacuum chamber means for establishing differential pressures between the central portion of the vacuum chamber means, the inlet and outlet portions of the vacuum chamber means, and an ambient environment outside the vacuum chamber means.

3. Apparatus for depositing a thin film hermetic coating on a drawn fiber as in claim 1 further comprising:
   laser means for generating a laser beam;
   optical means for facilitating entry of the laser beam into the vacuum chamber means adjacent a first end of the drawn fiber and exit of the laser beam therefrom adjacent a second end of the drawn fiber and for directing the laser beam along the longitudinal axis of the drawn fiber within the vacuum chamber means for selectively augmenting dissociation of the one or more selected reactive feedstock gases into one or more constituent elements for uniform deposition of said one or more constituent elements onto an outer surface of the drawn fiber.

4. Apparatus for depositing a thin film hermetic coating on a drawn fiber as in claim 1 wherein the inner surface of the cylindrical cathode comprises aluminum.

5. Apparatus for depositing a thin film hermetic coating on a drawn fiber as in claim 1 wherein the inner surface of the cylindrical cathode comprises silicon.

6. Apparatus for depositing a thin film hermetic coating on a drawn fiber as in claim 1 wherein the inner surface of the cylindrical cathode comprises magnesium.

7. Apparatus for depositing a thin film hermetic coating on a drawn fiber as in claim 1 wherein the inner surface of the cylindrical cathode comprises tin.

8. Apparatus for depositing a thin film hermetic coating on a drawn fiber as in claim 1 wherein the inner surface of the cylindrical cathode comprises titanium.

9. Apparatus for depositing a thin film hermetic coating on a drawn fiber as in claim 1 wherein the inner surface of the cylindrical cathode comprises zirconium.

10. Apparatus for depositing a thin film hermetic coating on a drawn fiber as in claim 1 wherein the inner surface of the cylindrical cathode comprises cerium.

11. Apparatus for depositing a thin film hermetic coating on a drawn fiber as in claim 1 wherein the inner surface of the cylindrical cathode comprises boron.

12. Apparatus for depositing a thin film hermetic coating on a drawn fiber as in claim 1 wherein the inner surface of the cylindrical cathode comprises lanthanum.

13. Apparatus for depositing a thin film hermetic coating on a drawn fiber as in claim 1 wherein the inner surface of the cylindrical cathode comprises titanium disilicide.

14. Apparatus for depositing a thin film hermetic coating on a drawn fiber as in claim 1 wherein the inner surface of the cylindrical cathode comprises tantalum disilicide.

15. Apparatus for depositing a thin film hermetic coating on a drawn fiber as in claim 1 wherein the inner surface of the cylindrical cathode comprises tungsten disilicide.

16. Apparatus for depositing a thin film hermetic coating on a drawn fiber as in claim 1 further comprising an annular cooling cavity positioned adjacent the cylindrical cathode and means for circulating a coolant within the annular cooling cavity for cooling the cylindrical cathode.

17. Apparatus for depositing a thin film hermetic coating on a drawn fiber as in claim 1 further comprising one or more additional cylindrical magnetrons positioned within the vacuum chamber means in spaced apart tandem relationship with said cylindrical magnetron and along the longitudinal axis thereof, each of the one or more additional cylindrical magnetrons comprising a cylindrical mesh extraction grid, a cylindrical mesh anode, coextensive with the cylindrical mesh extraction grid, and having a diameter greater than the diameter of the cylindrical mesh extraction grid, a cylindrical cathode, coextensive with the cylindrical mesh extraction grid and cylindrical mesh anode, and having a diameter greater than the diameter of the cylindrical mesh anode, and cylindrical solenoid means, coextensive with the cylindrical mesh extraction grid, cylindrical mesh anode, and cylindrical cathode, and having a diameter greater than the diameter of the cylindrical cathode; said power supply means being operative for applying independently controllable voltages to the cylindrical cathode, cylindrical mesh anode, cylindrical mesh extraction grid, and cylindrical solenoid means of said cylindrical magnetron and the one or more additional cylindrical magnetrons.

18. Apparatus for depositing a thin film hermetic coating on a drawn fiber as in claim 17 wherein an inner surface of the cylindrical cathode of said cylindrical magnetron and an inner surface of the cylindrical cathode of one of the one or more additional cylindrical magnetrons comprise two different materials.

19. Apparatus for depositing a thin film hermetic coating on a drawn fiber as in claim 18 wherein one of said two different materials comprises a refractory metal and the other of said two different materials comprises silicon.

20. Apparatus for depositing a thin film hermetic coating on a drawn fiber as in claim 1 wherein the cylindrical cathode and the cylindrical mesh extraction grid are fabricated to include a common material.

21. Apparatus for depositing a thin film hermetic coating on a drawn fiber as in claim 20 wherein the common material comprises a metal ceramic material.

22. Apparatus for depositing a thin film hermetic coating on a drawn fiber as in claim 20 wherein the common material comprises a metal carbon material.

23. Apparatus for depositing a thin film hermetic coating on a drawn fiber as in claim 1 wherein a feedstock gas comprises a mixture of argon and nitrogen.

24. Apparatus for depositing a thin film hermetic coating on a drawn fiber as in claim 1 wherein a feedstock gas comprises a mixture of argon and methane.

25. Apparatus for depositing a thin film hermetic coating on a drawn fiber as in claim 1 wherein a feedstock gas comprises a mixture of argon and nitrogen trifluoride.

26. Apparatus for depositing a thin film hermetic coating on a drawn fiber as in claim 1 wherein a feedstock gas comprises a mixture of argon and fluorine.

27. Apparatus for depositing a thin film hermetic coating on a drawn fiber as in claim 1 wherein a feedstock gas comprises a mixture of argon and nitrogen oxide.

28. Apparatus for depositing a thin film hermetic coating on a drawn fiber as in claim 1 wherein a feedstock gas comprises a mixture of argon and ammonia.

29. A method for depositing a thin film hermetic coating onto a drawn fiber comprising:
introducing a fiber to be coated into a vacuum chamber apparatus that includes a cylindrical magnetron having a longitudinal axis substantially coincident with a longitudinal axis of the drawn fiber, having a cylindrical mesh extraction grid coaxially positioned with respect to the drawn fiber to surround the drawn fiber, having a cylindrical mesh anode, coextensive with the cylindrical mesh extraction grid, of diameter greater than that of the cylindrical extraction grid, and coaxialy positioned with respect to the drawn fiber to surround the cylindrical mesh extraction grid, having a cylindrical cathode, coextensive with the cylindrical mesh extraction grid and cylindrical mesh anode, of diameter greater than that of the cylindrical mesh anode, and coaxially positioned with respect to the drawn fiber to surround the cylindrical mesh anode, and having a cylindrical solenoid, coextensive with the cylindrical mesh extraction grid, cylindrical mesh anode, and cylindrical cathode, of diameter greater than that of the cylindrical cathode, and coaxially positioned with respect to the drawn fiber to surround the cylindrical cathode;
extablishing a controlled gas atmosphere within the vacuum chamber apparatus, the controlled gas atmosphere including a rare gas and one or more reactive feedstock gases;
applying operating voltages to the elements of the cylindrical magnetron such that a cylindrical plasma is formed and substantially confined within a volume enclosed within the cylindrical cathode and without the cylindrical mesh anode, such that ions or electrons created in the cylindrical plasma are accelerated toward the drawn fiber for bombardment by said ions or electrons of the film deposited on the drawn fiber, such that a cathode material of an inner surface of the cylindrical cathode is sputtered therefrom and uniformly deposited, through the cylindrical mesh anode and through the cylindrical mesh extraction grid, onto an outer surface of the drawn fiber, and such that the cylindrical plasma dissociates the one or more reactive feedstock gases into one or more constituent elements, one or more of which constituent elements reacts with the material sputtered from the inner surface of the cylindrical cathode for uniform deposition onto the outer surface of the drawn fiber; and drawing the fiber along the longitudinal axis of the cylindrical magnetron at a constant rate to uniformly coat a desired length thereof.

30. A method for depositing a thin film hermetic coating onto a drawn fiber as in claim 29, further comprising the step of:

optically introducing a laser beam into the vacuum chamber aparatus adjacent a first end of the drawn fiber and along the longitudinal axis of the drawn fiber within the vacuum chamber apparatus for selectively augmenting dissociation of the one or more reactive feedstock gases into one or more constituent elements.

* * * * *